United States Patent

Kohama et al.

[11] Patent Number: 5,466,936
[45] Date of Patent: Nov. 14, 1995

[54] CHARGED PARTICLE MICROSCOPE

[75] Inventors: Yoshiaki Kohama; Kaoru Ohmori, both of Kawasaki, Japan

[73] Assignee: Nikon Corporation, Tokyo, Japan

[21] Appl. No.: 153,029

[22] Filed: Nov. 17, 1993

[30] Foreign Application Priority Data

Nov. 30, 1992 [JP] Japan ................... 4-319980

[51] Int. Cl.⁶ ................... H01J 37/26
[52] U.S. Cl. ................... 250/310; 250/397
[58] Field of Search ................... 250/310, 306, 250/397

[56] References Cited

U.S. PATENT DOCUMENTS

| | | | |
|---|---|---|---|
| 4,785,182 | 11/1988 | Mancuso et al. | 250/310 |
| 4,880,976 | 11/1989 | Mancuso et al. | 250/310 |
| 4,897,545 | 1/1990 | Danilatos | 250/310 |
| 4,992,662 | 2/1991 | Danilatos | 250/310 |
| 5,097,134 | 3/1992 | Kimoto et al. | 250/443.1 |
| 5,396,067 | 3/1995 | Suzuki et al. | 250/310 |

*Primary Examiner*—Bruce C. Anderson
*Attorney, Agent, or Firm*—Shapiro and Shapiro

[57] ABSTRACT

A charged particle electron microscope comprises: a sample chamber to which a gas used for gas amplification is supplied; a charged particle irradiation means for irradiating a sample set in the sample chamber with a charged particle beam; at least one first electrode member provided inside the sample chamber to which a first voltage is applied; at least one second electrode member provided inside the sample chamber to which a second voltage different from the first voltage is applied; a high voltage power source control means for controlling the first and the second voltages; and a synthesizer for synthesizing a current signal obtained from the first electrode member and a current signal obtained from the second electrode member, wherein the sample is observed by using a synthetic signal output from the synthesizer as a picture signal.

8 Claims, 2 Drawing Sheets

CHARGED PARTICLE MICROSCOPE

BACKGROUND OF THE INVENTION

1. Field of the Invention

The present invention relates to a charged particle microscope which is preferably applied to an electron microscope such as an environment-control-oriented-scan type electron microscope having a low vacuum sample chamber.

2. Related Background Art

An electron microscope is being used to observe or to measure the length of fine patterns formed on a sample. As such an electron microscope, an environment-control-oriented-scan type electron microscope has been recently developed, which enables observation and length measurement of a sample put in a low vacuum sample chamber.

FIG. 2 shows a conventional environment-control-oriented-scan type electron microscope. In FIG. 2, a sample 2 is contained in a sample chamber 1, and a first electrode 4 is attached through an insulating material 3 on the upper part of the inner wall of the sample chamber 1. Though schematically shown in FIG. 2, the first electrode 4 has a ringed shape whose axis coincides with the optical axis of an electronic optical system. A high vacuum chamber 6 is communicated with the sample chamber 1 through an aperture, and a charged particle irradiation means 7 is provided in the high vacuum chamber 6. The surface of the sample 2 is scanned with a primary electron beam 8 emitted from the charged particle irradiation means of the electron microscope.

Gas (for example, water vapour) which is used for gas amplification is charged from an external gas entrapping unit (not shown) through a gas charge valve 9 into the sample chamber 1. The same gas used for gas amplification is discharged out of the sample chamber 1 through a gas exhaust valve 10. The pressure of the gas inside the sample chamber 1 is detected by a pressure sensor 11. The result of this detection is applied to a pressure controller 12, which controls the gas charge valve 9 and the gas exhaust valve 10. Thus, the pressure of the gas inside the sample chamber 1 is kept within a range from 0.01 to 20 Torr, which is externally instructed.

The gas inside the sample chamber 1 also flows into the high vacuum chamber 6 through the aperture communicating with both chambers. So, in order to keep the pressure of the gas in the sample chamber 1 used for gas amplification at a predetermined value, the gas inside the high vacuum chamber 6 is constantly discharged by a vacuum pump (not shown). Such a mechanism is, however, indeed very complicated. Therefore, for brevity, FIG. 2 shows the system as if pressure control were performed only by the pressure controller 12.

The first electrode 4 is connected with a signal current input terminal 14a of a sample picture signal amplifier 13. The sample picture signal amplifier 13 consists of an operation amplifier 14 and a resistor 15. The signal current input terminal 14a is connected with the inverting input terminal of the operational amplifier 14 and an end of a the resistor 15. The non-inverting input terminal 14b of the operational amplifier 14 is connected with a floating ground terminal 16b of a first high voltage power source 16. The positive power source input terminal 14p of the operational amplifier 14 is connected with the positive power source output terminal 16p of the high voltage power source 16, while the negative power source input terminal 14n of the operational amplifier 14 is connected with the negative power source output terminal 16n. Thus, a sample picture signal S1 is generated at the output terminal of the operational amplifier 14 connected with the other end of the resistor 15.

In this constitution, the potential of the floating ground terminal 16b of the first high voltage power source 16 is controlled to be a direct current voltage E1, which is within a range from 0 to 600 V, by an externally applied signal voltage V1. In addition, the potential of the non-inverting input terminal 14b of the operational amplifier 14 is equal to the potential of the inverting input terminal. Accordingly, said direct current voltage E1 is applied to the first electrode 4.

On the other hand, a voltage of (E1+12)[V] is output from the positive power source output terminal 16p of the high voltage power source 16, while voltage of (E1−12)[V] is output from the negative power source output terminal 16n of the high voltage power source 16. That is, the sample picture signal amplifier 13 is an amplifier, to which two kinds of power having a difference of ±12[V] are applied, of current-input/voltage-output type. The overall potential of the sample picture signal amplifier 13 is increased up to the direct current voltage E1 by the externally applied signal voltage V1.

Now, suppose the voltage V1 is set to be, for example, 400[V]. When the charge particle irradiation means 7 of the electron microscope irradiates the sample 2 with the primary electron beam 8, secondary electrons 18 generated from the sample 2 travel toward the first electrode 4 to which the voltage E1 is applied. While travelling, the secondary electrons 18 repeatedly collide with molecules of the gas in the sample chamber 1 and are thus gas-amplified. Then, the secondary electrons 18 flow into the first electrode 4. The signals generated by the gas-amplified secondary electrons 18 flowing into the first electrode 4, that is, the secondary electron signals of the sample picture are converted into the sample picture signal S1 in the form of a voltage by the sample picture signal amplifier 13.

According to the above-mentioned prior art, the sample picture signal S1 is obtained from the secondary electrons which repeatedly collide with molecules of gas to be gas-amplified. In this case, however, the signal-noise ratio of the obtained sample picture signal is not large enough, which is troublesome. Therefore, improvement of the signal-noise ratio of the sample picture signal is desirable.

SUMMARY OF THE INVENTION

An object of the present invention is to improve the signal-noise ratio of the picture signal obtained from the sample which is observed or measured by the charged particle electron microscope utilizing gas amplification.

The charged particle electron microscope according to the present invention may comprise: a sample chamber to which the gas used for gas amplification is supplied; a charged particle irradiation means for irradiating a sample set in the sample chamber with a charged particle beam; at least one first electrode member provided inside the sample chamber to which a first voltage is applied; at least one second electrode member provided inside the sample chamber to which a second voltage different from the first voltage is applied; a high voltage power source control means for controlling the first and second voltages; and a synthesizing means for synthesizing a current signal obtained from the first electrode member and a current signal obtained from the second electrode member, wherein the sample is observed by using a synthetic signal output from the synthesizing means as a picture signal.

One example of the synthesizing means is a difference detection means for detecting a difference between the current signal obtained from the first electrode member and the current signal obtained from the second electrode member. Such a difference detection means may be a subtractor for subtracting the value of the current signal obtained from the first electrode member from the value of the current signal obtained from the second electrode member. Another example of the difference detection means has: an inverting means for inverting either the polarity of the current signal obtained from the first electrode member or the polarity of the current signal obtained from the second electrode member; and an adder for adding the current signal inverted by the inverting means to the current signal which is not inverted.

In addition, preferably, a pressure control means is provided in order to control the pressure of the gas used for gas amplification in the sample chamber so that the pressure is maintained within a range from 0.01 to 20 Torr.

According to the above-mentioned construction of the present invention, the sample irradiated with the primary electron beam generates secondary electrons. On colliding with the secondary electrons, molecules of the gas are separated into electrons and cations. These electrons generated in the process of ionization of the molecules of the gas can be said to gas-amplify the secondary electrons in respect of signal processing. According to the present invention, the fact that the cations of the molecules of the gas generated in the process of ionization by secondary electrons also carry sample picture data is utilized. For example, while the first electrode means detects the secondary electrons, the second electrode member detects the cations of the molecules of the gas. Conversely, the first electrode member may detect the cations of the molecules of the gas, wherein the second electrode member detects secondary electrons. Further, the high voltage power source control means can switch the first voltage and the second voltage applied to respective electrodes so as to select the electrode for detecting the secondary electrons and the electrode for detecting the cations from the first and second electrodes. The synthesizing means then synthesizes the current signal obtained from the first electrode member and the current signal obtained from the second electrode member. Thus, both the data of the secondary electrons and the data of the cations of the molecules of the gas are utilized, thereby improving the signal-noise ratio of the picture signal obtained from the sample.

When the synthesizing means is the difference detection means for detecting the difference between the current signal obtained from the first electrode member and the current signal obtained from the second electrode member, the data of the secondary electrons are added to the data of the cations of the molecules of the gas, and the sample is observed by utilizing the result of addition. In this case, the increasing amount of the signal is greater than that of noise in the difference signal serving as the sample picture signal. Accordingly, the signal-noise ratio of thus obtained sample picture signal is better than the signal-noise ratio of the sample picture signal obtained only from the secondary electrons. In addition, as subtraction of the signals surely reduces common mode noise, the signal-noise ratio is further improved.

Incidentally, the same effect can be obtained when a subtractor is used as the difference detection means or when an inverting means and an adder are used as the difference detection means.

If the pressure control means is provided which controls the pressure of the gas used for gas amplification in the sample chamber so that the pressure is maintained in the range from 0.01 to 20 Torr, the decrease of the primary electron beam is relatively small and the gas amplification action is relatively strong. Therefore better sample picture signal can be obtained.

DETAILED DESCRIPTION OF THE PREFERRED EMBODIMENT

An embodiment of the present invention will be described below with reference to FIG. 1. This embodiment is an environment-control-oriented-scan type electron microscope to which the present invention is applied.

Figure 1:
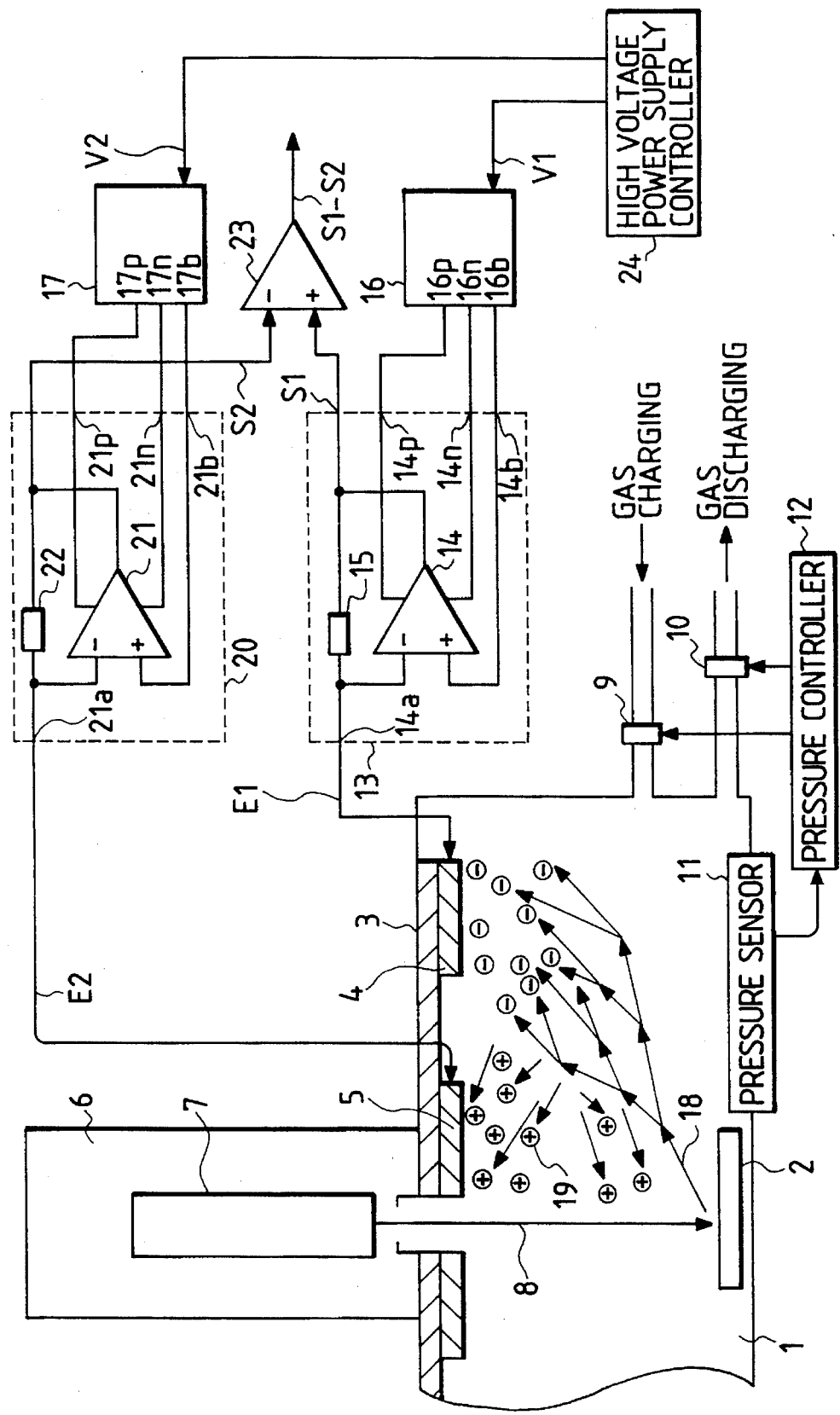
FIG. 1 is a block diagram, including a cross-sectional view, of an embodiment of the electron microscope according to the present invention, showing the mechanism and the signal processing unit.

FIG. 1 shows the mechanism and the signal processing unit of the embodiment of the electron microscope. As shown in FIG. 1, a sample 2 is contained in a sample chamber 1. A first electrode 4 and a second electrode 5 are attached through an insulating material 3 on the upper part of the inner wall of the sample chamber 1. The first electrode 4 is a ringed electrode which is positioned so that its axis coincides with the optical axis of an electric optical system. The second electrode 5 is a ringed electrode whose axis coincides with the optical axis of the electric optical system, and has smaller outer dimensions than the inner diameter of the first electrode 4. The inner diameter of the first electrode 4 and the outer dimensions of the second electrode 5 are determined so as to obtain such a distance between these electrodes as prevents discharge between the first and second electrodes while they are applied with voltage. A charged particle irradiation means 7 of the electron microscope, disposed in a high vacuum chamber 6 which is connected with the sample chamber 1 through an aperture, irradiates the sample 2 in the sample chamber 1 with a primary electron beam 8 to scan the surface of the sample 2. A gas (for example, water vapour) used for gas amplification is charged into the sample chamber 1 from an external gas entrapping unit (not shown) through a gas charge valve 9. The gas used for gas amplification is discharged out of the sample chamber 1 through a gas exhaust valve 10. The pressure of the gas in the sample chamber 1 is detected by a pressure sensor 11. The result of the detection is applied to a pressure controller 12, which controls the gas charge valve 9 and the gas exhaust valve 10. As a result, the pressure of the gas inside the sample chamber 1 is kept within the range from 0.01 to 20 Torr, which is externally directed.

Figure 2:
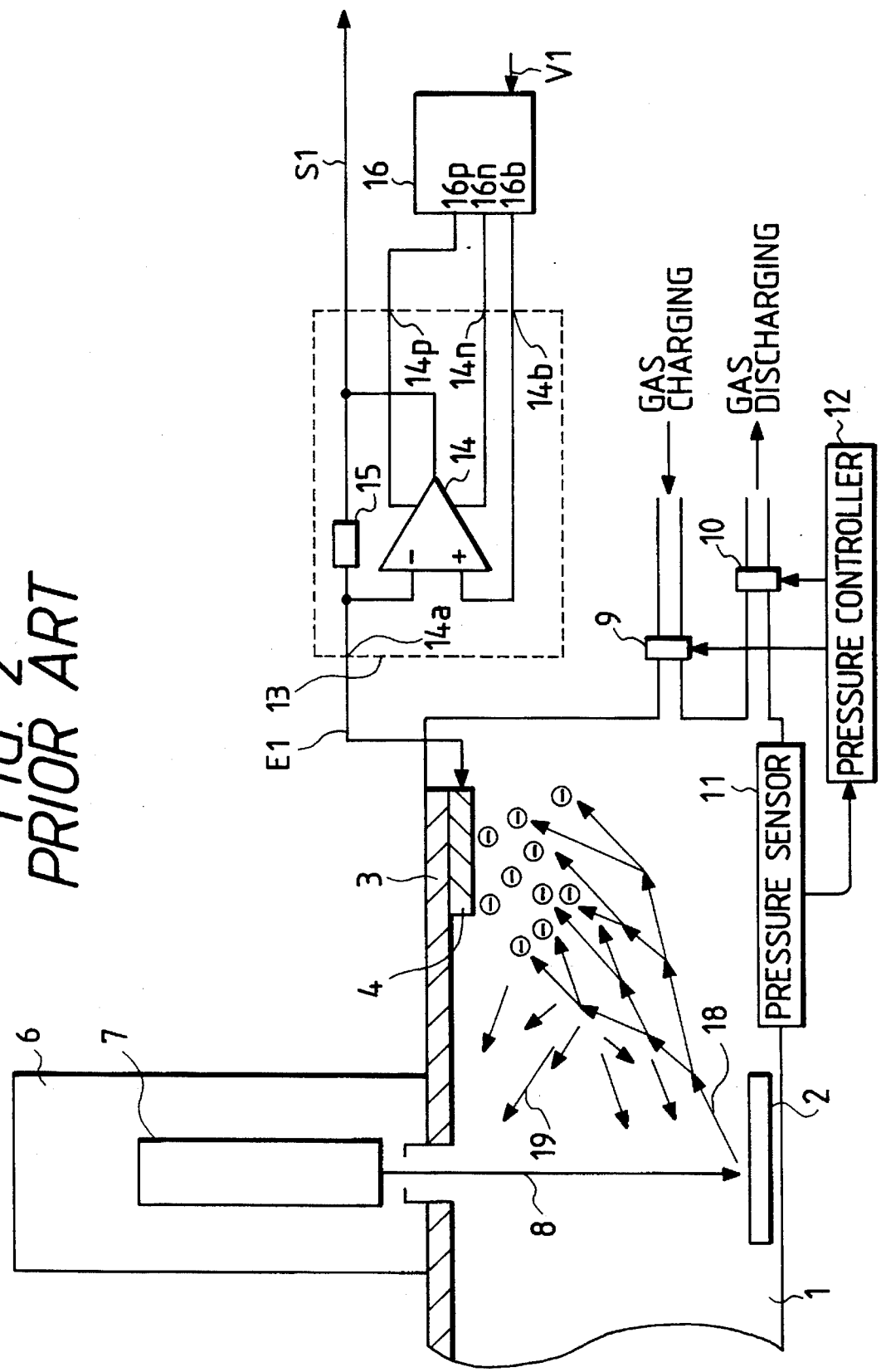
FIG. 2 is a block diagram, including a cross-sectional view, of a conventional electron microscope, showing the mechanism and the signal processing unit.

The gas in the sample chamber 1 also flows into the high vacuum chamber 6 through the aperture communicating with both chambers. So, the gas in the high vacuum chamber 6 is constantly discharged by a vacuum pump (not shown). Thus, the pressure of the gas in the sample chamber 1 is kept at a predetermined value. Such a mechanism is, however, indeed very complicated. Therefore, for brevity, FIG. 2 shows the system as if pressure control were performed only by the pressure controller 12.

The first electrode 4 is connected through a signal current input terminal 14a with the inverting input terminal of an operational amplifier 14 in a sample picture signal amplifier 13 and with one end of a resistor 15. The non-inverting input terminal 14b of the operational amplifier 14 is connected with the floating ground terminal 16b of a first high voltage power source 16, the positive power source input terminal 14p with the positive power source output terminal 16p, and the negative power source input terminal 14n with the negative power source output terminal 16n. At the output terminal of the operational amplifier 14 connected with the other end of the resistor 15, a sample picture signal S1 in the form of a voltage is generated, which is applied to the addition side input terminal of a subtractor 23. The first high voltage power source 16 applies a direct current voltage E1 to the first electrode 4. The direct current voltage E1 is determined within a range from 0 to 600[V] according to a signal voltage V1 output from a high voltage power source control means 24. The sample picture signal generated in the first electrode in the form of a current is converted by the sample picture signal amplifier 13 into the sample picture signal S1 in the form of a voltage.

On the other hand, the second electrode 5 is connected through a signal current input terminal 21a with the inverting input terminal of an operational amplifier 21 in a sample picture signal amplifier 20 and with one end of a resistor 22. The non-inverting input terminal 21b of the operational amplifier 21 is connected with the floating ground terminal 17b of a second high voltage power source 17, the positive power source input terminal 21p with the positive power source output terminal 17p, and the negative power source input terminal 21n with the negative power source output terminal 17n. At the output terminal of the operational amplifier 21 connected with the other end of the resistor 22, a sample picture signal S2 in the form of a voltage is generated, which is applied to the subtraction side input terminal of the subtractor 23. The potential of the floating ground terminal 17b of the second high voltage power source 17 is also controlled so as to be a direct current voltage E2, which is instructed by a signal voltage V2 given from a high voltage power source control means 24.

The positive power source output terminal 17p of the second high voltage power source 17 outputs a voltage of (E2+12)[V], while the negative power source output voltage 17n outputs a voltage of (E2−12)[V]. In other words, the sample picture signal amplifier 20 is also an amplifier, to which two kinds of power having a difference of ±12[V] are applied, of current-input/voltage-output type. The overall potential of the sample picture signal amplifier 20 is increased up to the direct current voltage E2 by a signal voltage V2 given by the high voltage power source control means 24. The potential of the non-inverting input terminal 21b of the operational amplifier 20 is equal to that of the inverting input terminal. Accordingly, the direct current voltage E2 is applied to the second electrode 5. The sample picture signal amplifier 20 is also a current/voltage converter consisting of the operational amplifier 21 and the resistor 22. The sample picture signal in the form of a current generated in the second electrode 5 is converted by the sample picture signal amplifier 20 into the sample picture signal S2 in the form of a voltage. Then, a difference signal of the difference (S1−S2) between the sample picture signals S1 and S2 is output from the subtractor 23 and applied to, for example, a CRT display (not shown).

Now, the functions of the present embodiment will be described. The direct current voltages E1 and E2 are set so that E1 is sufficiently higher than E2. For example, E1 is set to be 400[V], while E2 is set to be 0[V]. In this case, when the charged particle irradiation means 7 of the electron microscope irradiates the sample 2 with the primary electron beam 8, secondary electrons 18 generated from the sample 2 travel toward the first electrode 4 to which the direct current E1 is applied. While travelling, the secondary electrons 18 repeatedly collide with the molecules of the gas inside the sample chamber and ionize them. Electrons generated in the process of ionization, together with the secondary electrons 18, flow into the first electrode 4. Thus, the secondary electrons are gas-amplified by collisions with the molecules of the gas. The signals generated by the gas-amplified secondary electrons flowing into the first electrode 4, that is, the secondary electron current signals of the sample picture, are converted by the sample picture signal amplifier 13 into the sample picture signal S1 in the form of a voltage.

At the same time, cations 19, generated from the molecules of the gas when the secondary electrons 18 collide with the molecules of the gas and ionize them, travel toward the sample 2 substantially at the ground potential and the second electrode 5 at potential of 0[V]. The signal obtained from the cations flowing into the second electrode 5 is converted by the sample picture signal amplifier 20 into the sample picture signal S2 in the form of a voltage. If, say 70% of all the cations generated in the process of gas amplification of the secondary electrons are gathered to the second electrode 5, then the amount of noise in the sample picture signal S2 output from the sample picture signal amplifier 20 is the same as that in the sample picture signal S1 output from the sample picture signal amplifier 13. Also, the amount of signal in S2 is 70% of the amount of signal in S1. Note that the polarity of one of these two signals is the inverse of the polarity of the other. Therefore, the black-and-white sample picture obtained from the sample picture signal S1 is the inverse of that obtained from the sample picture signal S2.

Now the signal-noise ratio of the difference signal (S1−S2) output from the subtractor 23 will be considered. For this purpose, suppose the signal-noise ratio of the sample picture signal S1 to be 1. In this case, the amount of noise $N_{12}$ in the difference signal (S1−S2) can be given as in Expression (1):

$$N_{12} = (N_{S1}^2 + N_{S2}^2)^{1/2} \quad (1)$$
$$= (1^2 + 1^2)^{1/2} \cdot N_{S1}$$
$$= 1.4 \cdot N_{S1}$$

wherein $N_{S1}$ is the amount of noise in the sample picture signal S1, and $N_{S2}$ is the amount of noise in the sample picture signal S2 (which is equal to $N_{S1}$).

On the other hand, the amount of signal $S_{12}$ in the difference signal (S1−S2) can be given as in Expression (2):

$$S_{12} = S_{S1} + S_{S2} \quad (2)$$
$$= (1 + 0.7) \cdot S_{S1}$$
$$= 1.7 S_{S1}$$

wherein $S_{S1}$ is the amount of signal in the sample picture signal S1, and $S_{S2}$ is the amount of signal of the sample picture signal S2 (which is equal to $0.7 \cdot S_{S1}$).

Accordingly, the signal-noise ratio of the difference signal (S1−S2) can be given as in Expression (3):

$$\begin{aligned}
\text{The } S/N \text{ ratio} &= S_{12}/N_{12} \quad (3)\\
&= 1.7 \cdot S_{S1}/(1.4 \cdot N_{S1})\\
&\simeq 1.21
\end{aligned}$$

From the above calculation, it is understood that the signal-noise ratio of the difference signal (S1–S2) is improved by about 21% (that is, about 1.7 dB) as compared with the signal-noise ratio of the sample picture signal S1. Incidentally, the common mode noise which is common to the sample picture signals S1 and S2 is removed from the difference signal (S1–S2). Accordingly, the signal-noise ratio is, in fact, further improved.

Next, another example of the functions of the present invention will be described with reference to FIG. 1. At first, the direct current voltage E2 is set to be sufficiently higher than the direct current voltage E2. For example, E1 is set to be 0[V] while E2 is set to be 400[V]. Also, the subtractor 23 is used to subtract S1 from S2. In this case, the cations flow into the first electrode 4 and the gas-amplified secondary electrons flow into the second electrode 5. The difference signal (S2–S1) output from the subtractor 23 becomes, eventually, the same as the difference signal which is obtained when the direct current voltage E1 is sufficiently higher than the direct current voltage E2. In other words, even when the direct current voltage E2 is set to be sufficiently higher than the direct current E1, the circuit of the apparatus gives the same sample picture signal as in the previously described example in which the direct current voltage E1 is sufficiently higher than the direct current voltage E2. Which setting, of the above two, gives the sample picture signal having a better signal-noise ratio depends on the structure of respective electrodes 4 and 5, the kinds of the samples 2, and so on. Therefore, with the construction of this embodiment, excellent sample picture signals can be obtained, wherein the high voltage power source control means 24 switches the voltages applied to the first electrode 4 and the second electrode 5 according to the kinds of the samples, and so on.

The subtractor 23 in FIG. 1, which is the circuit for performing the fixed subtraction function may be replaced by a plurality of computing units capable of performing additions and subtractions in arbitrary order. In addition to the first electrode 4 and the second electrode 5, one or more additional electrodes may be provided in the sample chamber 1, and two of the electrodes are selected as the electrodes used to obtain the difference between the signals.

It can be easily understood that the subtractor 23 in FIG. 1 may also be replaced by a difference detector including: an inverting device for inverting the polarity of one of the sample picture signals S1 and S2; and an adder for adding the output signal of the inverting device to the signal which is not inverted.

Though the present invention is applied to the electron microscope in the above mentioned embodiment, the present invention may, of course, be applied to other kinds of apparatus such as a microscope which scans the sample with an ion beam. In other words, the present invention is not limited to the above-mentioned embodiment, but includes various kinds of constructions which fall within the fundamental principles illustrated herein.

What is claimed is:

1. A charged particle microscope comprising:
   (a) a sample chamber for containing a sample and into which a gas for gas amplification is charged, said sample being irradiated by a charged particle beam to generate secondary electrons;
   (b) a first electrode provided in the sample chamber, to which a first voltage is applied;
   (c) a second electrode provided in the sample chamber, to which a second voltage different from the first voltage is applied;
   (d) the first voltage and the second voltage being such that one of said first and second electrodes detects secondary electrons gas-amplified by said gas and the other of said first and second electrodes detects cations generated in the course of gas amplification, in which secondary electrons collide with gas molecules; and
   (e) a difference detector which detects a difference between a signal obtained from the first electrode and a signal obtained from the second electrode to produce a picture signal.

2. A charged particle microscope according to claim 1, wherein said difference detector is a subtractor which subtracts the signal obtained from the first electrode from the signal obtained from the second electrode.

3. A charged particle microscope according to claim 1, wherein said difference detector includes an inverter which inverts a polarity of the signal obtained from one of the first and second electrodes, and a synthesizer which synthesizes the inverted signal and the signal from the other of the first and second electrodes.

4. A charged particle microscope according to claim 1, further comprising a voltage controller for controlling the first voltage and the second voltage.

5. A charged particle microscope according to claim 1, wherein the first and second electrodes are coaxially arranged with respect to an axis of the charged particle beam.

6. A charged particle microscope according to claim 5, wherein the first and the second electrodes are ring-shaped.

7. A charged particle microscope according to claim 1, further comprising a pressure controller for controlling a pressure of the gas used for gas amplification in the sample chamber.

8. A charged particle microscope according to claim 1, wherein the pressure of the gas in the sample chamber is kept within a range from 0.01 to 20 Torr.

\* \* \* \* \*